United States Patent
Priewasser

(10) Patent No.: US 9,437,439 B2
(45) Date of Patent: Sep. 6, 2016

(54) PROCESSING METHOD FOR WAFER HAVING CHAMFERED PORTION ALONG THE OUTER CIRCUMFERENCE THEREOF FOLLOWED BY THINNING AND SEPARATING

(71) Applicant: Disco Corporation, Tokyo (JP)

(72) Inventor: Karl Priewasser, Munich (DE)

(73) Assignee: Disco Corporation, Tokyo (JP)

( * ) Notice: Subject to any disclaimer, the term of this patent is extended or adjusted under 35 U.S.C. 154(b) by 74 days.

(21) Appl. No.: 13/666,365

(22) Filed: Nov. 1, 2012

(65) Prior Publication Data
US 2013/0115861 A1    May 9, 2013

(30) Foreign Application Priority Data
Nov. 8, 2011   (JP) .................... 2011-244321

(51) Int. Cl.
H01L 21/304   (2006.01)
B24B 7/22    (2006.01)
(Continued)

(52) U.S. Cl.
CPC ............. *H01L 21/304* (2013.01); *B24B 7/228* (2013.01); *H01L 21/6835* (2013.01); *H01L 23/544* (2013.01); *H01L 2221/6834* (2013.01); *H01L 2221/68327* (2013.01);
(Continued)

(58) Field of Classification Search
CPC ....... B24B 1/00; B24B 7/228; H01L 21/304; H01L 21/3043; H01L 2221/68327
USPC .................. 451/41, 63; 438/460–465, 33
See application file for complete search history.

(56) References Cited

U.S. PATENT DOCUMENTS

| | | | | |
|---|---|---|---|---|
| 3,742,593 A | * | 7/1973 | Smith | ................. H01L 29/0661 257/171 |
| 4,261,781 A | * | 4/1981 | Edmonds | ............... B28D 1/005 148/DIG. 28 |
| 4,793,101 A | * | 12/1988 | Dlouhy | ................ H01L 21/304 257/E21.237 |

(Continued)

FOREIGN PATENT DOCUMENTS

| | | |
|---|---|---|
| JP | 03-183130 | 8/1991 |
| JP | 2000-158334 | 6/2000 |

(Continued)

OTHER PUBLICATIONS

Wafer Edge Trim Processing for Advanced Thinning, Fumihiro et al.*

*Primary Examiner* — Joseph J Hail
*Assistant Examiner* — Arman Milanian
(74) *Attorney, Agent, or Firm* — Greer Burns & Crain Ltd.

(57) ABSTRACT

A wafer processing method for reducing the thickness of a wafer to a predetermined thickness, the wafer having a chamfered portion along the outer circumference thereof. The wafer processing method includes a stacked wafer forming step of attaching a support substrate to the front side of the wafer to thereby form a stacked wafer, and a chamfered portion removing step of positioning a cutting blade having a rotation axis parallel to the stacking direction of the stacked wafer formed by the stacked wafer forming step so that the outer circumference of the cutting blade faces the chamfered portion of the wafer, and then making the cutting blade cut into the wafer from the outer circumference toward the center thereof to thereby partially remove the chamfered portion in the range corresponding to the predetermined thickness from the front side of the wafer.

2 Claims, 8 Drawing Sheets

(51) Int. Cl.
  *H01L 23/544* (2006.01)
  *H01L 21/683* (2006.01)
(52) U.S. Cl.
  CPC ........... *H01L 2221/68381* (2013.01); *H01L 2223/54493* (2013.01); *H01L 2924/0002* (2013.01)

(56) References Cited

U.S. PATENT DOCUMENTS

| | | | | |
|---|---|---|---|---|
| 6,110,391 | A * | 8/2000 | Takei | H01L 21/304 216/2 |
| 6,113,721 | A * | 9/2000 | Secco d'Aragona | B24B 9/065 156/154 |
| 7,308,745 | B2 * | 12/2007 | Diehl | B23B 1/00 29/50 |
| 7,406,994 | B2 * | 8/2008 | Martinez | B28D 5/0011 156/762 |
| 8,173,518 | B2 * | 5/2012 | Liu | H01L 21/76256 257/E21.237 |
| 2002/0019200 | A1 * | 2/2002 | Ikeno | B24B 1/00 451/42 |
| 2005/0215056 | A1 * | 9/2005 | Morrow | H01L 21/187 438/689 |
| 2007/0072393 | A1 * | 3/2007 | Aspar | H01L 21/304 438/459 |
| 2009/0042363 | A1 * | 2/2009 | Miyazaki | H01L 21/76256 438/459 |
| 2009/0095399 | A1 * | 4/2009 | Zussy et al. | 156/60 |
| 2010/0248414 | A1 * | 9/2010 | Liu | H01L 21/76256 438/70 |
| 2011/0097874 | A1 * | 4/2011 | Broekaart | H01L 21/304 438/459 |
| 2012/0270394 | A1 * | 10/2012 | Shih | H01L 21/76898 438/667 |

FOREIGN PATENT DOCUMENTS

| | | |
|---|---|---|
| JP | 2000-173961 | 6/2000 |
| JP | 2010-171955 | 8/2010 |
| WO | WO2005/038903 A1 | 4/2005 |

* cited by examiner

PROCESSING METHOD FOR WAFER HAVING CHAMFERED PORTION ALONG THE OUTER CIRCUMFERENCE THEREOF FOLLOWED BY THINNING AND SEPARATING

BACKGROUND OF THE INVENTION

1. Field of the Invention

The present invention relates to a wafer processing method for removing a chamfered portion formed along the outer circumference of a wafer and next reducing the thickness of the wafer to a predetermined thickness.

2. Description of the Related Art

A plurality of devices such as ICs and LSIs are formed on the front side of a semiconductor wafer so as to be partitioned by a plurality of crossing division lines (streets). The back side of the semiconductor wafer is ground by a grinding apparatus to reduce the thickness of the wafer to a predetermined thickness. Thereafter, the semiconductor wafer is cut along the division lines by using a cutting apparatus (dicing apparatus) to thereby obtain the individual devices divided from each other. These devices are widely used in various electrical equipment such as mobile phones and personal computers. The grinding apparatus for grinding the back side of the wafer includes a chuck table for holding the wafer and a grinding unit including a rotatable grinding wheel, which has a plurality of abrasive members for grinding the wafer held on the chuck table. By using this grinding apparatus, the wafer can be ground with high accuracy to obtain a desired thickness.

In grinding the back side of the wafer by using the grinding apparatus, a protective tape is attached to the front side of the wafer for the purpose of protecting the devices formed on the front side of the wafer. However, when the thickness of the wafer is reduced to about tens of micrometers by the grinding step, the wafer cannot be stably supported by a low degree of rigidity of the protective tape, so that the wafer supported to the protective tape becomes flexible as a whole and therefore unstable. Accordingly, there is a problem in handling the wafer in the grinding step and any subsequent steps. To facilitate the handling of the wafer reduced in thickness by the grinding step, there is described in Japanese Patent Laid-open No. 2000-158334, for example, a method including the steps of attaching a rigid support substrate to the front side of a wafer and next grinding the back side of the wafer.

In general, an arcuate chamfered portion is formed along the outer circumference of a semiconductor wafer in the range from the front side to the back side of the semiconductor wafer. Accordingly, when the back side of the wafer is ground to reduce the thickness of the wafer, a knife edge (eaves-like shape) is formed by an arcuate surface of the chamfered portion and a ground surface of the wafer, causing danger and chipping on the outer circumference of the wafer. As a result, there arises a problem that the quality of each device may be reduced or the wafer may be broken. To solve this problem, Japanese Patent Laid-open No. 2000-173961 discloses a semiconductor device manufacturing method including the steps of forming a cut groove on the front side of a semiconductor wafer along the boundary between a flat portion (front side surface) and a chamfered portion formed along the outer circumference of the wafer and next grinding the back side of the wafer so that the thickness of the wafer becomes less than the depth of the cut groove.

SUMMARY OF THE INVENTION

However, in the case that the cut groove is formed on the front side of the wafer along the boundary between the flat portion and the chamfered portion of the wafer as by the semiconductor device manufacturing method disclosed in Japanese Patent Laid-open No. 2000-173961 prior to attaching a support substrate or a protective tape to the front side of the wafer, there arises a problem that cut dust may waft on the front side of the wafer and stick to the front side of each device, causing a reduction in quality of each device. Particularly in the case of a wafer having a plurality of solid-state image sensors such as CCDs and CMOSs, there arises a fatal problem such that the imaging performance of the solid-state image sensors may be reduced. Further, excessive cleaning is required to remove the cut dust sticking to the front side of each device.

In the case of removing the chamfered portion after attaching the support substrate to the front side of the wafer, the chamfered portion must be removed from the back side of the wafer toward the front side thereof, causing the requirement of much time to process the wafer. Further, a cutting blade having a thickness larger than the width of the chamfered portion is required, so that the cost for the cutting blade itself is increased. In addition, partial wear of the cutting blade is prone to occur due to continuous processing, causing the requirement of frequent exchange of the cutting blade. In the case of using a cutting blade having a thickness smaller than the width of the chamfered portion, circular cutting must be performed plural times along the outer circumference of the wafer, causing a reduction in productivity.

It is therefore an object of the present invention to provide a wafer processing method which can reduce the thickness of the wafer to a predetermined thickness without damage to the wafer in a shorter time at a lower cost as compared with the related art.

In accordance with an aspect of the present invention, there is provided a wafer processing method for reducing the thickness of a wafer to a predetermined thickness, the wafer having a chamfered portion along the outer circumference thereof, the wafer processing method including a stacked wafer forming step of attaching a support substrate to the front side of the wafer to thereby form a stacked wafer; a chamfered portion removing step of positioning a cutting blade having a rotation axis parallel to the stacking direction of the stacked wafer formed by the stacked wafer forming step so that the outer circumference of the cutting blade faces the chamfered portion of the wafer, and then making the cutting blade cut into the wafer from the outer circumference toward the center thereof to thereby partially remove the chamfered portion in the range corresponding to the predetermined thickness from the front side of the wafer; and a thickness reducing step of grinding the back side of the wafer constituting the stacked wafer after performing the chamfered portion removing step to thereby reduce the thickness of the wafer to the predetermined thickness.

Preferably, the wafer processing method further includes a holding step of holding the stacked wafer on a chuck table of a cutting apparatus in the condition where the support substrate of the stacked wafer comes into contact with the chuck table before performing the chamfered portion removing step; the chamfered portion removing step including the steps of positioning the cutting blade so that the rotation axis of the cutting blade becomes parallel to the rotation axis of the chuck table and the outer circumference of the cutting blade faces the chamfered portion of the wafer; making the cutting blade cut into the wafer from the outer circumference toward the center thereof; rotating the chuck table at least 360° to thereby partially remove the chamfered portion in the range corresponding to the predetermined thickness from the front side of the wafer.

In the chamfered portion removing step of the wafer processing method according to the present invention, the cutting blade is positioned so that the outer circumference of the cutting blade faces the chamfered portion of the wafer, and the cutting blade is next made to cut into the wafer from the outer circumference toward the center thereof to thereby partially remove the chamfered portion in the range corresponding to the predetermined thickness from the front side of the wafer. Accordingly, in the thickness removing step subsequent to the chamfered portion removing step, the back side of the wafer can be ground to reduce the thickness of the wafer to the predetermined thickness without damage to the wafer in a shorter time at a lower cost as compared with the related art.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENT

Figure 1:
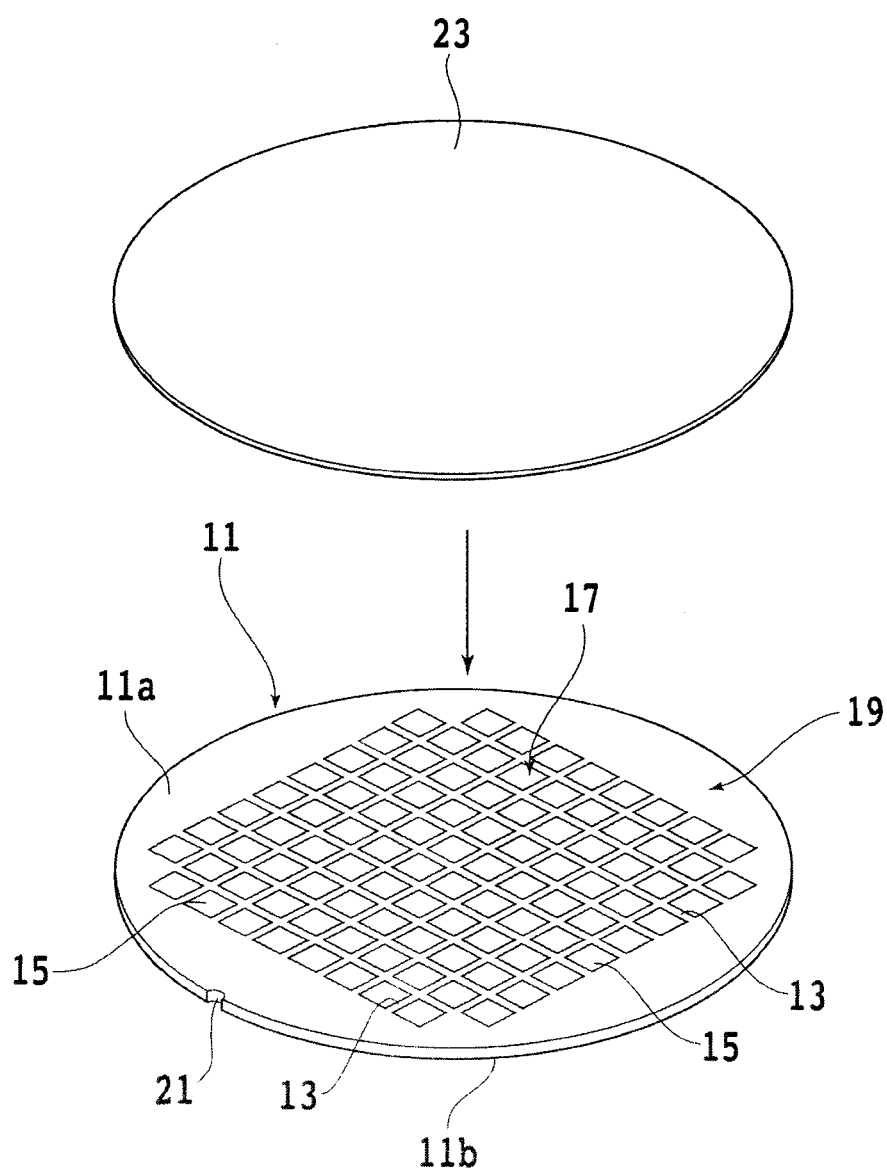
FIG. 1 is a perspective view showing a stacked wafer forming step.

A preferred embodiment of the present invention will now be described in detail with reference to the drawings. FIG. 1 is a perspective view showing a stacked wafer forming step. Reference numeral 11 denotes a semiconductor wafer formed from a silicon wafer having a thickness of 700 μm, for example. A plurality of crossing division lines (streets) 13 are formed on the front side 11a of the semiconductor wafer 11, thereby partitioning a plurality of rectangular regions where a plurality of devices 15 such as ICs and LSIs are respectively formed. The front side 11a of the semiconductor wafer 11 is a flat portion and includes a device area 17 where the devices 15 are formed and a peripheral marginal area 19 surrounding the device area 17. The outer circumference of the semiconductor wafer 11 is formed with a notch 21 as a mark for indicating the crystal orientation of the silicon wafer.

Figure 2:
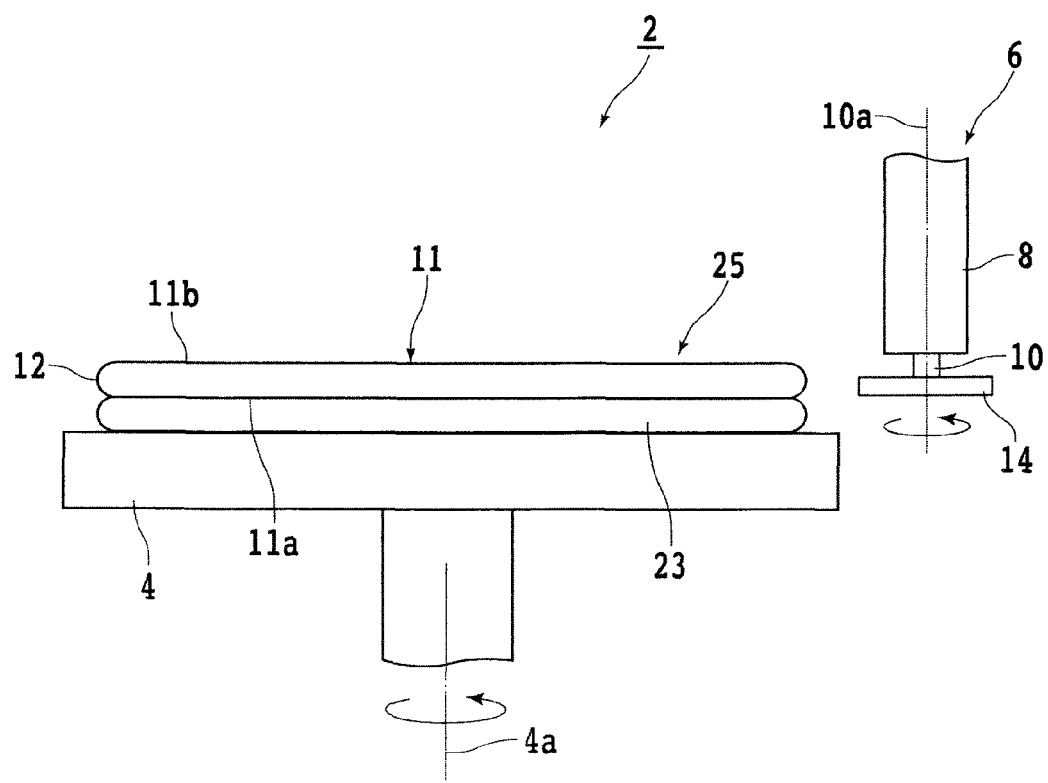
FIG. 2 is a side view showing a condition where a cutting blade having a thickness equal to a predetermined thickness of a wafer is positioned so that the outer circumference of the cutting blade faces the outer circumference of the wafer in a chamfered portion removing step according to a first preferred embodiment of the present invention.

According to the wafer processing method of the present invention, the stacked wafer forming step is performed as a first step as shown in FIG. 1 in such a manner that a support substrate 23 as a protective member is attached to the front side 11a of the wafer 11 by using an adhesive to thereby form a stacked wafer 25 as shown in FIG. 2. The support substrate 23 may be formed from a silicon wafer, glass substrate, etc. After performing a thickness reducing step to be hereinafter described, the support substrate 23 must be removed from the wafer 11. Accordingly, the adhesive is preferably selected from a hot water wetting type adhesive such that the adhesive force is reduced by immersion in hot water. However, the attachment of the support substrate 23 in this stacked wafer forming step is not limited to the attachment using the adhesive, but a wafer may be directly bonded to a support substrate to thereby form an SOI (Silicon On Insulator) wafer.

After forming the stacked wafer 25, a holding step is performed as shown in FIG. 2 in such a manner that the stacked wafer 25 is held under suction on a chuck table 4 of a cutting apparatus 2 in the condition where the support substrate 23 of the stacked wafer 25 comes into contact with the holding surface (upper horizontal surface as viewed in FIG. 2) of the chuck table 4. The outer circumference of the wafer 11 is formed as an arcuate chamfered portion 12 ranging from the front side 11a to the back side 11b of the wafer 11. Reference numeral 6 denotes a cutting unit included in the cutting apparatus 2. The cutting unit 6 includes a spindle housing 8, a spindle 10 rotatably accommodated in the spindle housing 8, and a cutting blade 14 fixed to the front end (lower end as viewed in FIG. 2) of the spindle 10. The cutting unit 6 is arranged so that the axis (vertically extending rotation axis) 10a of the spindle 10 is parallel to the stacking direction of the stacked wafer 25. In this preferred embodiment, the rotation axis 10a of the spindle 10, i.e., the rotation axis of the cutting blade 14 is parallel to the vertically extending rotation axis 4a of the chuck table 4.

Figure 3:
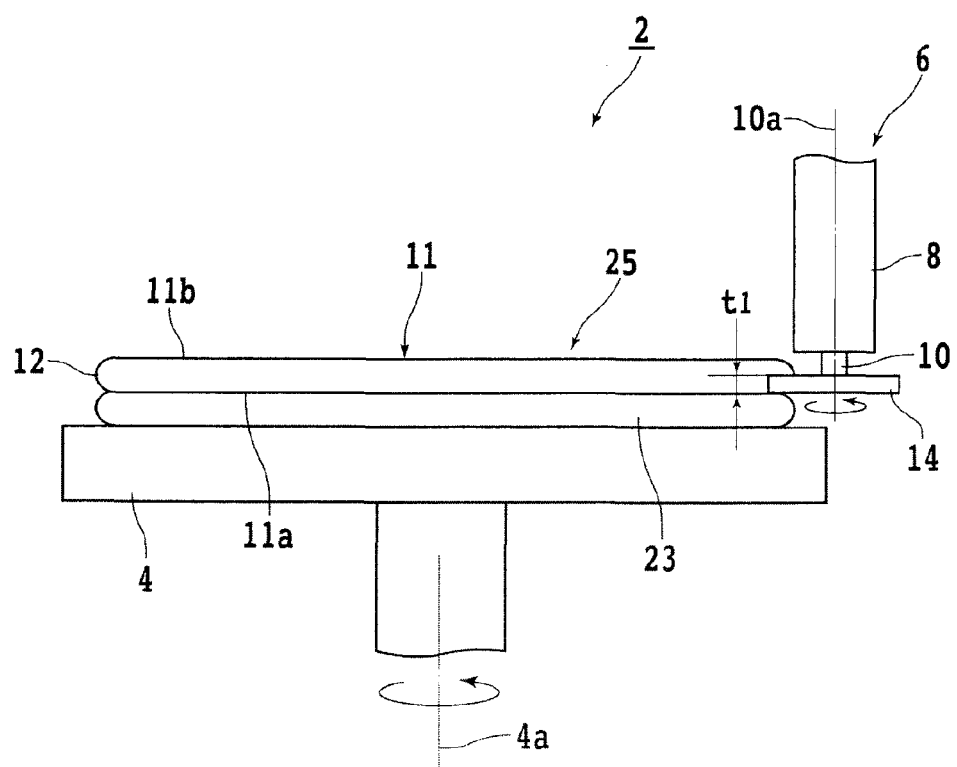
FIG. 3 is a side view showing a condition where the cutting blade shown in FIG. 2 is made to cut into the wafer from the outer circumference toward the center thereof.

After performing the holding step of holding the stacked wafer 25 on the chuck table 4 of the cutting apparatus 2 as mentioned above, a chamfered portion removing step is performed in the following manner. As shown in FIG. 2, the cutting blade 14 is positioned so that the outer circumference of the cutting blade 14 faces the chamfered portion 12 of the wafer 11 in the range corresponding to a predetermined thickness t1 from the front side 11a of the wafer 11. At this time, the chuck table 4 may be in a rotating condition as shown in FIG. 2 or in a rotation stopped condition. More specifically, as shown in FIG. 3, the chuck table 4 and the cutting unit 6 are relatively moved in a horizontal direction by a predetermined distance as rotating the cutting blade 14 at a high speed (e.g., 30000 rpm), thereby making the cutting blade 14 cut into the wafer 11 from the outer circumference toward the center thereof.

Figure 6:
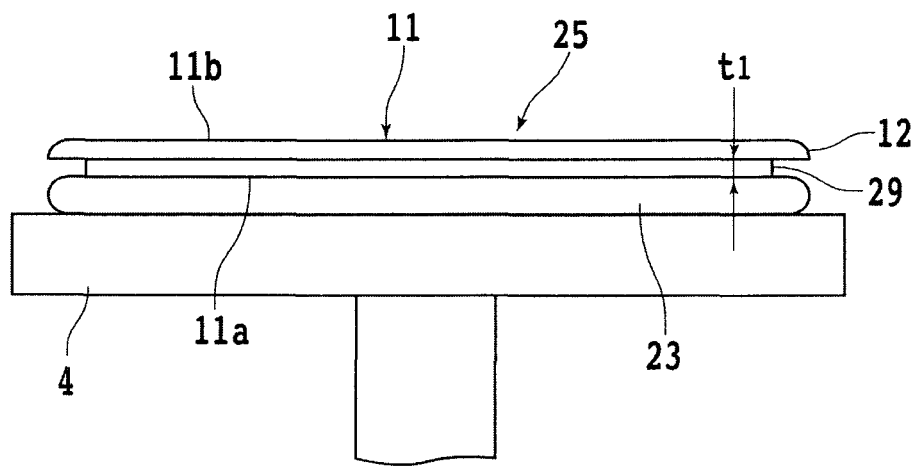
FIG. 6 is a side view showing a stacked wafer obtained by the chamfered portion removing step.

Thereafter, the chuck table 4 is rotated at least 360° to thereby partially remove the chamfered portion 12 in the range corresponding to the predetermined thickness t1 from the front side 11a of the wafer 11. FIG. 6 is a side view showing the condition obtained by performing the chamfered portion removing step to form an annular cut groove 29 on the outer circumference of the wafer 11. In the preferred embodiment shown in FIGS. 2 and 3, the cutting blade 14 has a thickness equal to the predetermined thickness t1 from the front side 11a of the wafer 11. Accordingly, by making the cutting blade 14 cut into the wafer 11 from the outer circumference toward the center thereof and then rotating the chuck table 4 at least 360°, the annular cut groove 29 having a width equal to the predetermined thickness t1 is formed on the outer circumference of the wafer 11 in the range from the front side 11a.

Figure 4:
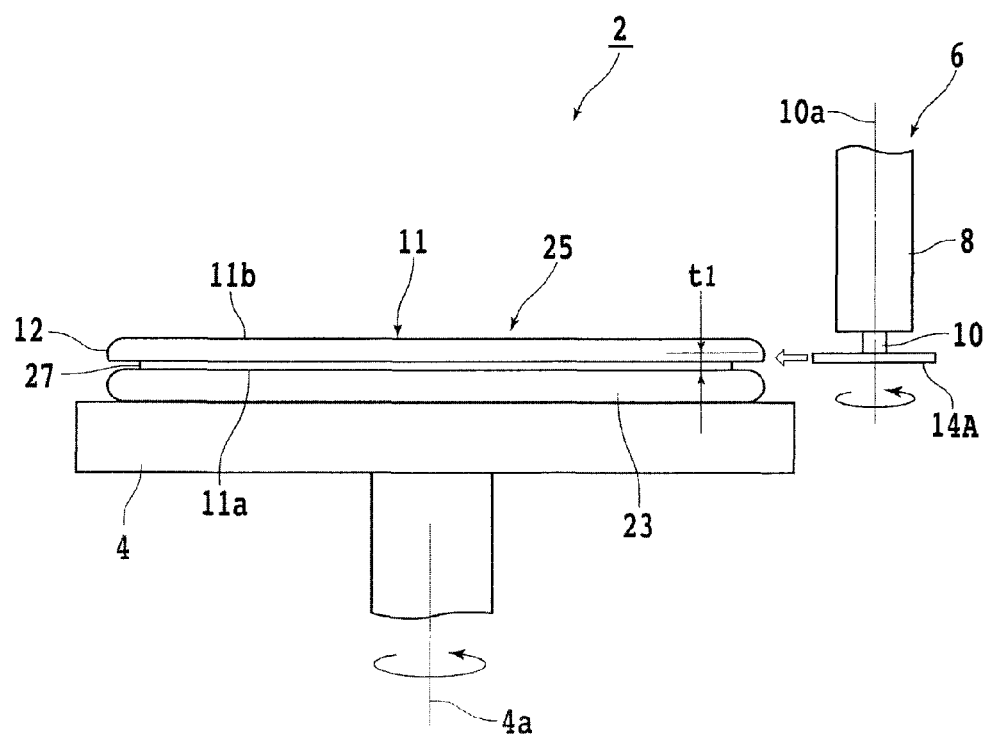
FIG. 4 is a side view similar to FIG. 2, showing a second preferred embodiment using a cutting blade having a thickness less than the predetermined thickness.

FIG. 4 is a side view showing a second preferred embodiment of the chamfered portion removing step in the present invention. In this preferred embodiment, a cutting blade 14A having a thickness smaller than the predetermined thickness t1 is used as shown in FIG. 4. Accordingly, by once performing the chamfered portion removing step, an annular cut groove 27 having a width smaller than the predetermined thickness t1 is formed on the outer circumference of the wafer 11 as shown in FIG. 4. Thereafter, the chamfered portion removing step is repeated plural times to thereby form the annular cut groove 29 having the width equal to the predetermined thickness t1 as shown in FIG. 6.

Figure 5:
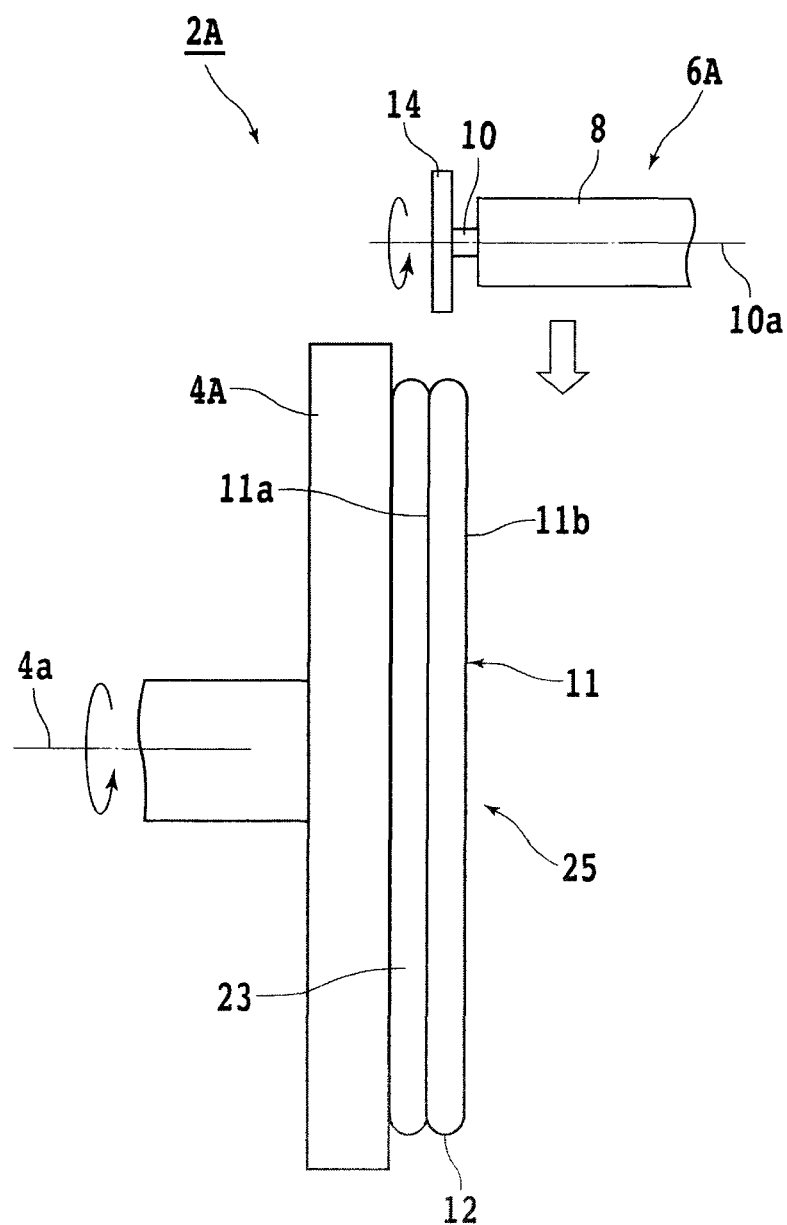
FIG. 5 is a side view similar to FIG. 2, showing a third preferred embodiment using a cutting blade having a horizontally extending rotation axis.

FIG. 5 is a side view of an essential part of a cutting apparatus 2A, showing a third preferred embodiment of the chamfered portion removing step in the present invention. In this preferred embodiment, the cutting apparatus 2A includes a chuck table 4A having a horizontally extending rotation axis 4a, and the stacked wafer 25 is held under suction on the chuck table 4A in the condition where the support substrate 23 of the stacked wafer 25 comes into the holding surface (vertical surface as viewed in FIG. 5) of the chuck table 4A as shown in FIG. 5. Accordingly, the stacked wafer 25 is held on the chuck table 4A so that the stacking direction of the stacked wafer 25 is horizontal. The cutting apparatus 2A includes a cutting unit 6A arranged so that the rotation axis 10a of the spindle 10 is horizontal. The other configuration of the cutting unit 6A is the same as that of the cutting unit 6 shown in FIG. 2. This cutting unit 6A is a general cutting unit.

In this preferred embodiment, the cutting blade 14 is positioned so that the outer circumference of the cutting blade 14 faces the chamfered portion 12 of the wafer 11 in the range corresponding to the predetermined thickness t1 from the front side 11a of the wafer 11. Thereafter, the cutting blade 14 and the chuck table 4A are relatively moved in a vertical direction by a predetermined distance, thereby making the cutting blade 14 cut into the wafer 11 from the outer circumference toward the center thereof. Thereafter, in this cut-in condition of the cutting blade 14, the chuck table 4A is rotated at least 360° to thereby partially remove the chamfered portion 12 in the range corresponding to the predetermined thickness t1 from the front side 11a of the wafer 11. The thickness of the cutting blade 14 is equal to the predetermined thickness t1, so that by rotating the chuck table 4A at least 360° in the condition where the cutting blade 14 cuts in the wafer 11 from the outer circumference thereof, the annular cut groove 29 having the width equal to the predetermined thickness t1 is formed on the outer circumference of the wafer 11 in the range from the front side 11a.

Figure 7:
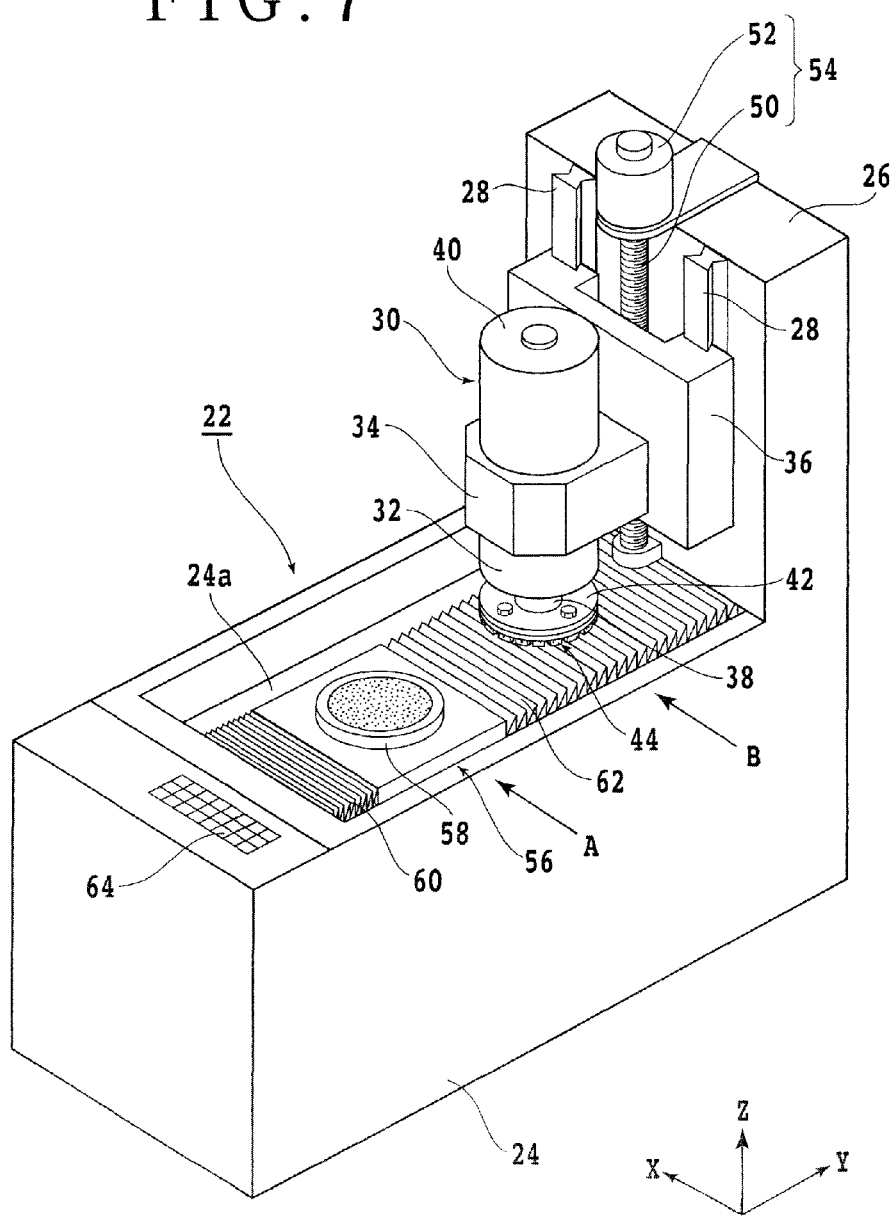
FIG. 7 is a perspective view of a grinding apparatus suitable for use in performing a thickness reducing step.

After performing the chamfered portion removing step mentioned above, a thickness reducing step is performed in such a manner that the back side 11b of the wafer 11 constituting the stacked wafer 25 is ground by using a grinding apparatus 22 shown in FIG. 7 to thereby reduce the thickness of the wafer 11 to the predetermined thickness t1. The grinding apparatus 22 shown in FIG. 7 includes a base 24 having a column 26 vertically extending at the rear end. A pair of vertically extending guide rails 28 are fixed to the front surface of the column 26. A grinding unit 30 is mounted on the column 26 so as to be vertically movable along the guide rails 28. The grinding unit 30 includes a spindle housing 32 and a support member 34 for supporting the spindle housing 32. The support member 34 is mounted on a moving base 36 vertically movable along the guide rails 28. The grinding unit 30 includes a spindle 38 rotatably accommodated in the spindle housing 32, a motor 40 for rotating the spindle 38, a wheel mount 42 fixed to the lower end of the spindle 38, and a grinding wheel 44 detachably mounted on the wheel mount 42.

The grinding apparatus 22 further includes a grinding unit feeding mechanism 54 for vertically moving the grinding unit 30 along the guide rails 28. The grinding unit feeding mechanism 54 is composed of a ball screw 50 threadedly engaged with the moving base 36 for vertically moving the moving base 36 along the guide rails 28 and a pulse motor 52 for rotating the ball screw 50. Accordingly, when the pulse motor 52 is driven, the ball screw 50 is rotated to thereby vertically move the moving base 36. The upper surface of the base 24 is formed with a recess 24a, and a chuck table mechanism 56 is provided in the recess 24a. The chuck table mechanism 56 has a chuck table 58. The chuck table 58 is movable in the Y direction by a chuck table moving mechanism (not shown) to selectively take a loading/unloading position A set on the front side of the grinding unit 30 as shown in FIG. 7 and a grinding position B opposed to the grinding unit 30 on the lower side thereof. A pair of bellows 60 and 62 are provided on the front and rear sides of the chuck table 58. Further, an operation panel 64 allowing the input of grinding conditions or the like by an operator of the grinding apparatus 22 is provided on the upper surface of the front end portion of the base 24.

Figure 8:
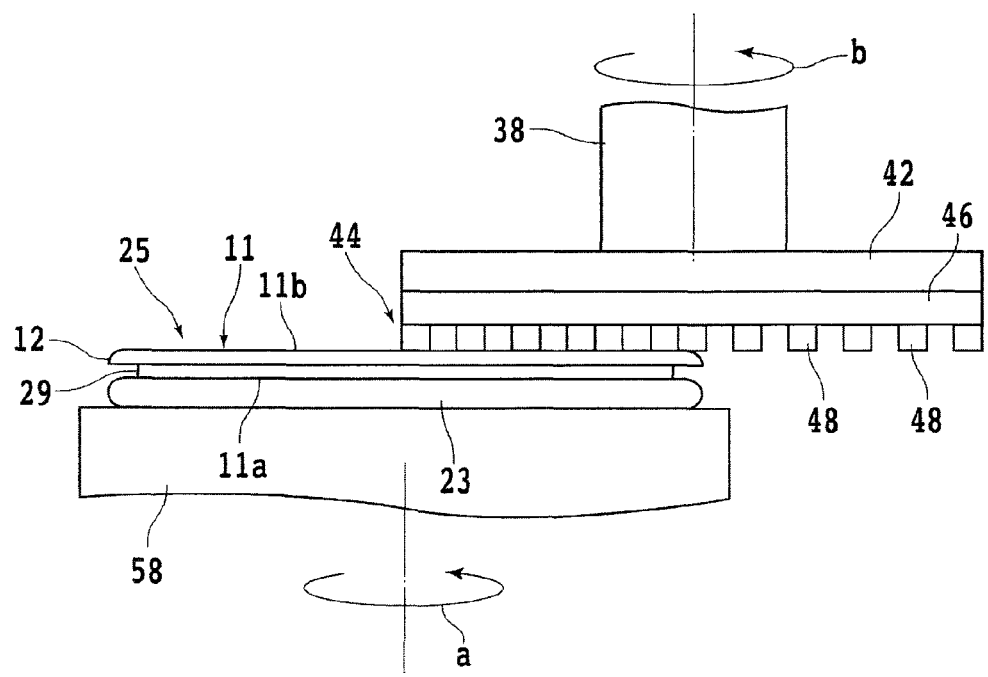
FIG. 8 is a side view showing the thickness reducing step.

In the thickness reducing step of grinding the back side 11b of the wafer 11 to reduce the thickness of the wafer 11 to the predetermined thickness t1, the stacked wafer 25 is held under suction on the chuck table 58 of the grinding apparatus 22 in the condition where the support substrate 23 of the stacked wafer 25 is in contact with the upper surface of the chuck table 58 as shown in FIG. 8. In this condition, the back side 11b of the wafer 11 is exposed. The grinding wheel 44 is detachably mounted by a plurality of screws (not shown) on the lower surface of the wheel mount 42 fixed to the lower end of the spindle 38 of the grinding unit 30. The grinding wheel 44 is composed of a wheel base 46 and a plurality of abrasive members 48 annularly arranged on the free end surface (lower surface) of the wheel base 46 as shown in FIG. 8.

In the thickness reducing step, the chuck table 58 is rotated at 300 rpm, for example, in the direction shown by an arrow a and the grinding wheel 44 is rotated at 6000 rpm, for example, in the direction shown by an arrow b as shown in FIG. 8. At the same time, the grinding unit feeding mechanism 54 is operated to bring the abrasive members 48 of the grinding wheel 44 into contact with the back side 11b of the wafer 11. Further, the grinding wheel 44 is fed downward by a predetermined amount at a predetermined feed speed. This grinding is performed as measuring the thickness of the wafer 11 by using a contact or noncontact type thickness gauge until the thickness of the wafer 11 is reduced to the predetermined thickness t1. When the thickness of the wafer 11 becomes the predetermined thickness t1, the remaining part of the chamfered portion 12 is fully removed. Accordingly, no knife edge is formed by the thickness reducing step, so that the damage to the wafer 11 can be prevented.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A device wafer processing method for reducing the thickness of a device wafer to a predetermined thickness, said device wafer having a chamfered portion along the outer circumference thereof, said wafer processing method comprising:
    a stacked wafer forming step of attaching a support substrate to a front side of said device wafer to thereby form a stacked wafer followed by;
    a chamfered portion removing step of positioning a single cutting blade that is thinner in width than the device wafer, the single cutting blade having a rotation axis parallel to the stacking direction of said stacked wafer formed by said stacked wafer forming step so that the outer circumference of said single cutting blade faces said chamfered portion of said device wafer, and then making said single cutting blade cut into said device wafer without cutting into or damaging the support substrate from the outer circumference toward the center thereof to thereby remove said chamfered portion to at least said predetermined thickness from the front side of said device wafer; followed by
    thickness reducing step of grinding a back side of said device wafer constituting said stacked wafer after performing said chamfered portion removing step to thereby reduce the thickness of said device wafer to said predetermined thickness; followed by
    a separation step of removing said support substrate from said device wafer.

2. The device wafer processing method according to claim 1, further comprising a holding step of holding said stacked wafer on a chuck table of a cutting apparatus in a condition where said support substrate of said stacked wafer comes into contact with said chuck table before performing said chamfered portion removing step;
    said chamfered portion removing step including the steps of:
    positioning said cutting blade so that the rotation axis of said cutting blade becomes parallel to the rotation axis of said chuck table and the outer circumference of said cutting blade faces said chamfered portion of said device wafer;
    making said cutting blade cut into said device wafer from the outer circumference toward the center thereof; and
    rotating said chuck table at least 360° during said chamfered portion removing step.

* * * * *